United States Patent [19]

Monier et al.

[11] Patent Number: 4,727,255

[45] Date of Patent: Feb. 23, 1988

[54] SILICONE DIELECTRIC GEL CRYOGENIC DETECTOR INTERFACE

[75] Inventors: John M. Monier; W. Gene Wilcox, both of Tucson, Ariz.

[73] Assignee: Hughes Aircraft Company, Los Angeles, Calif.

[21] Appl. No.: 870,056

[22] Filed: Jun. 3, 1986

[51] Int. Cl.$^4$ ............................................. H01L 23/42
[52] U.S. Cl. .................................... 250/352; 250/338; 62/514 R
[58] Field of Search .......................... 250/352, 338 R; 62/514 R; 357/83

[56] References Cited

U.S. PATENT DOCUMENTS 3,980,476 9/1976 Wysocki ................................ 430/21
4,479,367 10/1984 Buller ................................. 62/514 R

*Primary Examiner*—Janice A. Howell
*Assistant Examiner*—Constantine Hannaher
*Attorney, Agent, or Firm*—Charles D. Brown; A. W. Karambelas

[57] ABSTRACT

The inherent video noise and video-flashing encountered at the liquid nitrogen boiling point within a cryogenically cooled detector is substantially eliminated by filling any space which might entrap air with a flowable self-sealing silicone gel. The gel is sticky and maintains its adherence to both the cold finger and dewar as it is cooled to cryogenic temperatures without losing its internal self-cohesion. In the illustrated embodiment a two-part gel manufactured by Dow Corning under the trademark Sylgard 527 is employed. The gel is characterized by being self-sealing to at least a temperature within the range of $-60$ degrees C. to $-100$ degrees C. In addition, the gel is thermally stable at all temperatures from elevated ambient temperatures through cryogenic temperatures.

13 Claims, 5 Drawing Figures

SILICONE DIELECTRIC GEL CRYOGENIC DETECTOR INTERFACE

BACKGROUND OF THE INVENTION

1. Field of the Invention

The present invention relates to the field of cryogenic detectors and in particular to the means employed within infrared cryogenic detectors to deal with the thermal effect of liquefied air in contact with the cold finger of the detector.

2. Description of the Prior Art

Infrared detectors, used in optical guidance systems, operate at cryogenic temperatures at or below the boiling point of liquid nitrogen, i.e., approximately 77 degrees Kelvin. The infrared detector is cooled by means of a cold finger within a dewar. As the entire apparatus cools from ambient temperatures, gases in the air within the dewar liquefy. Ultimately, the nitrogen liquefies at approximately 77 degrees K. Continued cooling toward absolute zero tends to degrade the signal-to-noise ratio of the detector so that detector operation reaches an optimum working range of between 80 degrees K. and 65 degrees K. Liquid nitrogen forms around the cold finger and provides a thermally resistive coupling between the cold finger, which typically may be operating at a temperature of approximately 24 degrees K., and the temperature sensitive infrared detector.

A cryoengine and/or heater is controlled in a closed loop in order to maintain the detector temperature within the optimum range. The heating and cooling of the cold finger through closed loop control is seriously effected by the nonlinear thermal resistance of the liquid nitrogen which forms between the cold finger and the detector. This nonlinearity is due in large part to the heat of vaporization of the nitrogen as it boils and recondenses. The boiling, bubbling and thermal nonlinearity of the liquid nitrogen coupling in the thermal circuit of the cold finger and the detector substantially and seriously interferes with the efficiency of the detector and degrades the signal-to-noise ratio. When this thermal nonlinearity begins to predominate, what occurs is known as thermo-flash or video-flashing which is manifested as large erratic swings in the signal generated by the detector.

In order to avoid video-flashing, the prior art has sought various means to exclude or control the liquid nitrogen which inherently forms between the cold finger and the dewar. A typical method for such control is wrapping the cold finger with tape or other thermally resistive solid material in order to minimize the liquid nitrogen from the interstitial space between the cold finger and the dewar. The difficulty and limitation of this solution is the requirement for extremely tight tolerances between the cold finger and the glass bore of the detector if the tape is to uniformly fill the interlying void. Microscopic gaps are invariably formed along the length of the cold finger and dewar permitting the liquefication of nitrogen and consequent nonlinearity of the thermal resistance between the cold finger and the detector.

In order to avoid the microscopic gaps which are inherently formed between the cold finger and the dewar when any solid material was used as the filler, designs have been derived to fill the void between the dewar and cold finger with greases and gels. However, every compound, which has been used as a filler, has been characterized by physical or thermal properties which significantly change as cryogenic temperatures are approached. Typically, the grease or gel freezes solid and contracts. The material adheres at points inside the dewar to the inside glass surface with a bond strength exceeding the internal bond strength of the glass. Therefore, as the compound freezes and contracts, small portions of the glass are pulled away from the inside surface of the dewar, and a plurality of small pits are formed inside the dewar surface. Continued temperature cycling leads to catastrophic degradation or breakage of the dewar when this occurs.

Therefore, some means is needed whereby video-flashing in a cryogenically cooled detector assembly can be avoided by means compatible with continued temperature cycling between ambient to cryogenic temperatures.

BRIEF SUMMARY OF THE INVENTION

The invention is an improvement in a cryogenically cooled detector apparatus including a detector and a cryoengine for cooling the detector. The improvement comprises a cold finger for thermally coupling the cryo-engine to the detector, a dewar for thermally insulating the cold finger means, and a flowable gel. The cold finger is disposed at least in part in the dewar. The flowable gel is disposed between the cold finger and dewar and substantially fills the space between the cold finger and dewar. A liquid release agent, MS-143, is used inside of the dewar to minimize adhesion to the glass. As a result, liquefication of air within the space between dewar and the cold finger is eliminated and video-flashing of the detector is eliminated.

The gel is a silicone polymer which completely fills that portion of the space between the cold finger and dewar which is cooled to approximately 77 degrees K. and colder.

In the illustrated embodiment the gel is SYLGARD 527 manufactured by Dow Corning. More generally the flowable gel is a gel which is self-sealing within the temperature range of −60 degrees C. to −100 degrees C. Furthermore, the flowable gel is sticky and adheres to the cold finger and dewar in the range from ambient temperatures through cryogenic temperatures. The flowable gel is substantially resistant to outgassing when cooled from ambient to cryogenic temperatures.

Alternatively the invention can be characterized as an improvement in a cryogenically cooled detector including a detector and a cryo-engine for cooling the detector. The invention comprises a cold finger for thermally coupling the cryo-engine to the detector, and a dewar enveloping the cold finger. The dewar insulates the cold finger from the ambient. A space is defined between the dewar and cold finger. A self-sealing gel is disposed in the space and excludes all liquefiable gases from the space. The self-sealing gel is characterized by an ability to maintain adhesion to the dewar and cold finger and to self-seal from ambient temperatures to at least temperatures within the range of −60 degrees C. to −100 degrees C. As a result, video noise levels in the detector are reduced and video-flashing eliminated.

The self-sealing gel comprises a silicone polymer potting compound. The self-sealing gel is adherent to the cold finger, and dewar. The self-sealing gel provides a stable thermal conductive path between the cold finger and the detector. The self-sealing gel is adherent to the cold finger and dewar in the range from ambient temperatures through cryogenic temperatures. The self-sealing gel assumes a nonuniform temperature when the detector is cooled to cryogenic temperatures. A portion of the self-sealing gel assumes a cryogenic temperature and a continuous remaining portion of the self-sealing gel assumes a warmer temperature. The self-sealing gel is characterized by stable self-cohesion during the cooling and contraction.

The invention is also an improvement in a method for preventing video-flashing in a cryogenically cooled detector. The method comprises the steps of cooling a cold finger with a cryoengine, transferring the cooling through the cold finger to a detector, and insulating the cold finger with an enveloping dewar. The dewar and cold finger define a space therebetween. The improvement comprises the steps of: substantially completely filling all of the space in the vicinity of the detector with a flowable thermally stable self-sealing gel; and maintaining adhesion of the gel with the cold finger and dewar as the gel is cooled to the cryogenic temperatures. As a result video noise is reduced and the video-flashing is eliminated.

The invention and its various embodiments may now be understood by turning to the following detailed description.

DETAILED DESCRIPTION OF THE PREFERRED EMBODIMENTS

The operation of a cryogenically cooled infrared detector is substantially improved by the use of a silicone dielectric gel in the void between the cold finger and dewar within the detector apparatus. A flowable, self-sealing, sticky, silicone polymer with minimal adherence at cryogenic temperatures is used as the filling compound between the cold finger and dewar with a liquid release agent, MS-143 used in the dewar to minimize glass stress. In the illustrated embodiment a two-part silicone polymer or potting compound manufactured by Dow Corning under the trademark SYLGARD and in particular SYLGARD 527 is employed.

The inherent video noise and video-flashing encountered at the liquid nitrogen boiling point within a cryogenically cooled detector is substantially eliminated by filling any space which might entrap air with a flowable self-sealing silicone gel. The gel is sticky and maintains its adherence to both the cold finger and dewar as it is cooled to cryogenic temperatures without losing its internal self-cohesion. In the illustrated embodiment a two-part gel manufactured by Dow Corning under the trademark SYLGARD 527 is employed. The gel is characterized by being self-sealing to at least a temperature within the range of −60 degrees C. to −100 degrees C. In addition, the gel is thermally stable from elevated temperatures through cyrogenic temperatures.

Figure 1:
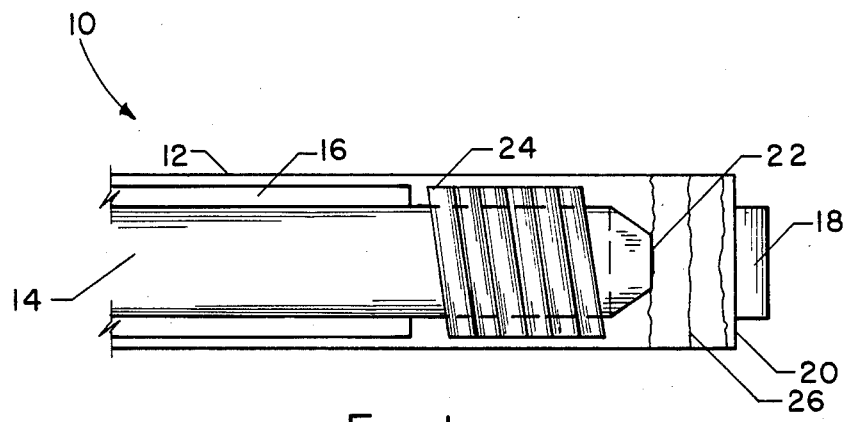
FIG. 1 is a diagrammatic cross-sectional depiction of a portion of a cold finger and dewar devised according to the prior art.

However, before considering the properties of the silicone polymer, turn first to FIG. 1 wherein a portion of an infrared cryogenic detector assembly is diagrammatically depicted in cross-sectional view.

Cryogenic detector 10 is comprised of a conventional glass dewar 12 encasing a thermally conductive metallic cold finger 14. Cold finger 14 is thermally coupled to an electrical heater 16 and driven by a cryo-engine (not shown). Cold finger 14 provides a means for transferring heat or cold through the length of dewar 12 to an infrared semiconductor detector chip 18 mounted on lowermost end 20 of dewar 12 opposite a corresponding lowermost end 22 of cold finger 14. Dewar 12, and chip 18 are both conventional, except to the extent as modified as described below, and therefore will not be further discussed.

Figure 5:
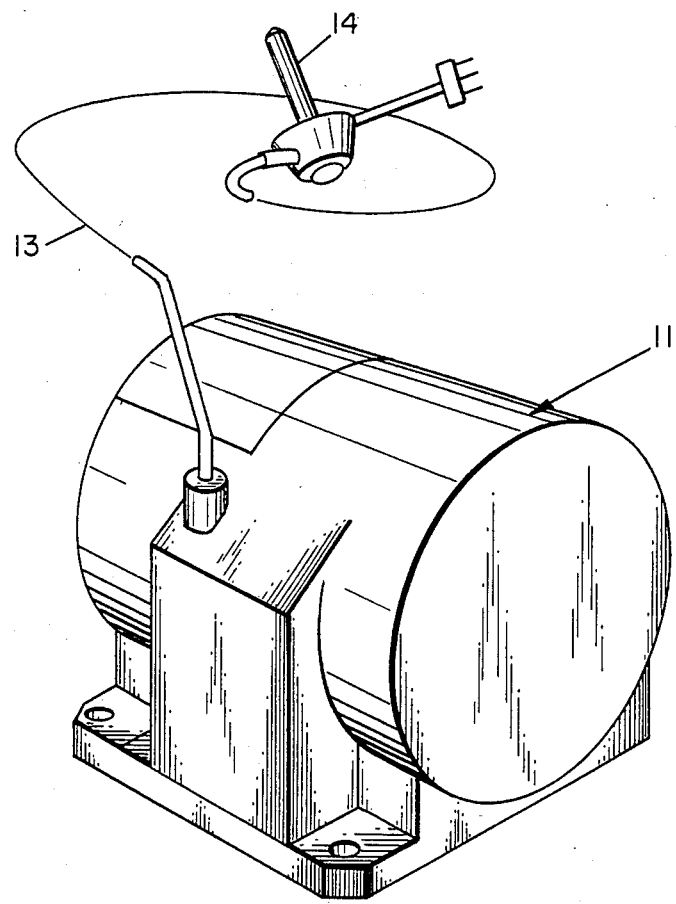
FIG. 5 is a simplified perspective view of a cryo-engine coupled to a cold finger and corresponding fitting.

FIG. 5 is a simplified schematic perspective illustration of a conventional cryo-engine 11 coupled by means of a cryogenic line 13 to cold finger 14 and conventional cold finger fitting 15. Inasmuch as the details of creating a low temperature and conveying the low temperature to cold finger 14 are entirely conventional and irrelevant to the invention, cryo-engine 11 of FIG. 5 will be omitted from the details of the remaining drawings.

Prior art cryogenic detector 10 in FIG. 1 has been modified according to conventional prior art understandings by one or more wrappings of Mylar ™, or generically polyester, tape 24 around the longitudinal exterior surfaces 26 of cold finger 14 within dewar 12. Similarly, the inside end of dewar 12 may be packed with a thermally resistive dielectric material 26 to provide a defined thermal resistance between end 22 of cold finger 14 and detector chip 18. In the embodiment of FIG. 1, packing 26 is comprised of a thermally resistive material manufactured by Abrahams of Tuscon, Ariz. under the trademark BEKIPOR.

As depicted in exaggerated form in FIG. 1, a certain amount of space is still left open between Mylar ™, or generically polyester, tape wrappings 24 and within the capacity of the wadding material 26 for entrapped air within dewar 12. As cold finger 14 is brought down to cryogenic temperatures, the entrapped air liquefies and thereby introduces substantial and serious thermal nonlinearities as illustrated in connection with FIG. 3.

Figure 3:
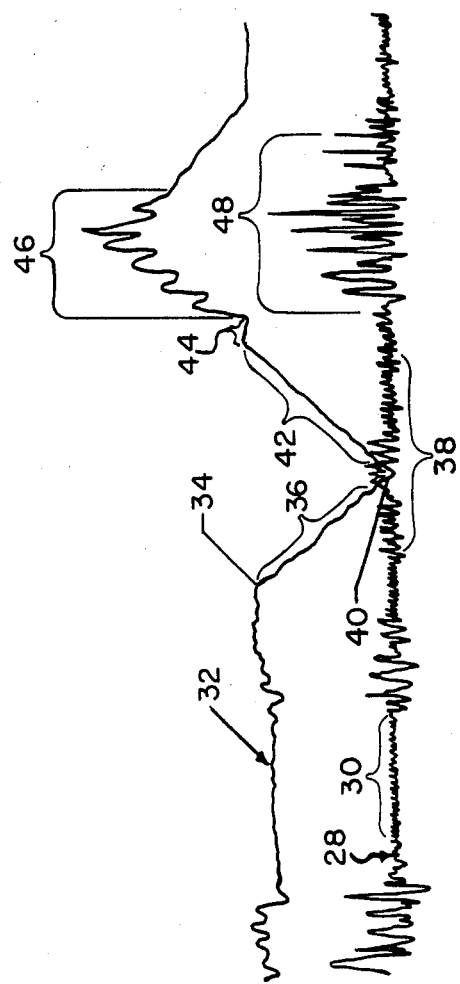
FIG. 3 is a graph showing the performance of the prior art cold finger of FIG. 1 as a function of temperature.

Turn now to FIG. 3 and consider the operation of the prior art cryogenic detector as shown in FIG. 1. The vertical axis of FIG. 3 represents the voltage magnitude of the various illustrated signals and the horizontal axis represents time. The signals of FIG. 3 are the results of an actual demonstration run of a prior art detector as shown in FIG. 1 which has been brought to cryogenic temperatures, cooled and heated up through the boiling point of nitrogen. Line 28 represents the detector signal amplified by a gain of 400. The vertical magnitude of line 28 represented, for example, in portion 30, is typical of inherent and acceptable noise levels of the detector. Line 32 is representative of the detector temperature. The detector is maintained at an approximately constant temperature until point 34, at which point the temperature is decreased as represented by the downwardly sloping portion 36 of line 32 representing detector temperature. Portion 38 of line 28 illustrates the increase in inherent thermal noise within detector 18 as temperature is decreased. At point 40, the temperature of detector 18 is intentionally increased, as indicated by the upward sloping portion 42 of line 32. A short plateau is reached at portion 44 of line 32 as the liquid nitrogen within the cold finger-to-dewar interstitial spaces passes through the 77-degree K. transition point of liquid nitrogen. Thereafter, the temperature of detector chip 18 fluctuates wildly in portion 46 of line 32 through the peak-to-peak swings of 1½ to 2 degrees K. In the meantime, as depicted on line 28, the electrical output signal from detector 18 similarly becomes highly erratic and unstable through portion 48 of line 28. The high peak-to-peak noise levels illustrated in portion 40 is known as video noise and is many times greater than the inherent noise within detector 18. In fact, the video noise amplitudes become great enough to significantly degrade or swamp the signal to-noise ratio of detector 18 and thereby limit its usefulness.

Figure 2:
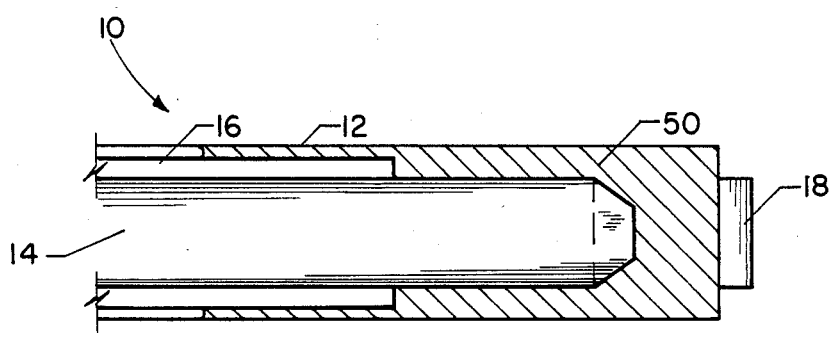
FIG. 2 is a diagrammatic cross-sectional depiction of a cold finger improved according to the invention.

Returning now to the depiction of FIG. 2, the identical cryogenic detector 10 of FIG. 1 has been improved according to the invention, in the illustrated embodiment of FIG. 2. Mylar TM, or generically polyester, tape 24 and wadding 26 have been removed from the cryogenic detector 10. Instead, the entire interstitial space between cold finger 14 and dewar 12 has been completely or at least substantially filled with a flowable, self-sealing, sticky silicone polymer. In illustrated embodiment the polymer is SYLGARD 527. However, it is to be expressly understood that equivalent gels now known or later discovered could also be used without departing from the spirit and scope of the invention.

Compound 50 is a viscous gel which provides a seal near heater 16 and along cold finger 14. The gel is self-healing so that, as it contracts when it cools within dewar 12, it remains soft at the warmer portions within dewar 12. No air is thus sucked into dewar 12 during cooling of its various component parts because of the gel seal around heater 16. The gel does not tear or crack in the contraction process.

Figure 4:
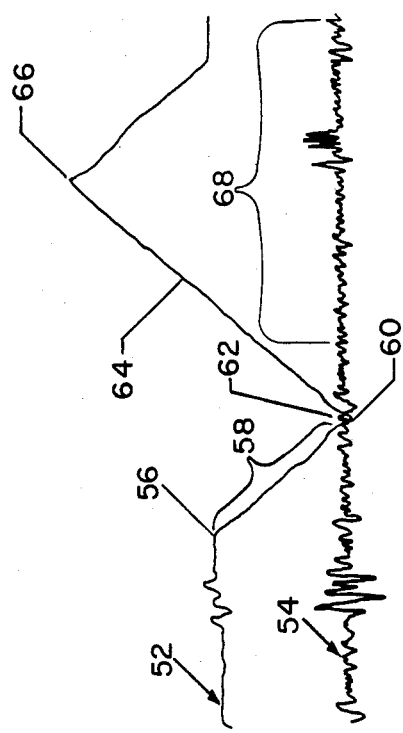
FIG. 4 is a graph showing the performance of a detector when improved according to the invention as depicted in FIG. 2.

Before considering the gel further, turn now to the graph of FIG. 4, wherein the operation of the cryogenic detector 10 is depicted in greater detail. Again, the vertical axis of FIG. 4 represents voltages or temperature as may be appropriate, whereas the horizontal axis represents time. A demonstration run of the dewar of FIG. 2 is run which is identical to that run with respect to the dewar of FIG. 1 and depicted in FIG. 3.

Curve 52 of FIG. 4 is representative of the detector temperature while curve 54 is the voltage output of detector 18 again amplified by a gain of 400. As before, the detector is maintained at a substantially constant temperature until a point 56 is reached. At this point, detector 18 is cooled as depicted by the descending portion 58 of curve 52. A minimum temperature is reached at point 60 after which the temperature of detector 18 is again increased, as represented by the rising portion 62 of curve 52. However, the rising temperature portion 62 of curve 52, unlike the rising temperature portion 42 of curve 32, has no 77-degree K. transition point since air is excluded or at least substantially excluded from the interior of dewar 12. Had a transition point existed, it would have been expected to occur in the area denoted by reference numeral 64. The temperature of detector 18 continues to be increased to point 66 equal to that shown in the corresponding point of FIG. 3. However, it may be readily observed that the inherent noise within detector 18 as depicted by curve 54 remains substantially uniform throughout its entire range and in particular within portion 68 or curve 54 which includes a transition of temperature of detector 18 through the 77-degree K. transition point.

The noise which is observed in FIG. 4 is inherently produced within detector 18 and is in fact substantially decreased from even the background video noise from the same detector as depicted in FIG. 3. In the test run illustrated here, the background video noise of detector 18 was decreased by 16.6 dB in addition to entirely eliminating video-flashing.

SYLGARD 527 is a nonreversible stable gel that is highly hydrophobic. It is characterized by establishing a homogeneous, nongaseous thermal resistance that has resulted in predictable thermal characteristics down to at least 45 degrees K. The two-part silicone polymer is flowable or self-sealing from ambient temperatures down into the range of −60 degrees C. to −100 degrees C. The gel is flowable or self-sealing in the sense that if the gel is pulled away from the glass or cold finger by an exterior agent, the gel will relax and flow back to adhere to glass dewar 12 or cold finger 14. Furthermore, the gel is sticky at ambient working temperatures so that when it is loaded into dewar 12 it readily sticks or adheres to the inside surfaces of dewar 12 and to the metallic or ceramic portion of heater 16 and cold finger 14. However, to minimize the adhesion or stickiness of gel 50 to the glass dewar when it is lowered to temperatures of 77 degrees K. and colder, a liquid release agent, MS-143, is coated on dewar 12 to minimize stress on the glass. In addition to the stable and homogeneous low temperature characteristics of gel 50, gel 50 furthermore is characterized by highly desirable high-temperature or ambient characteristics. Firstly, at higher temperatures gel 50 does not dry out or boil away. Its flowability is not substantially increased at higher temperatures so that it becomes liquid and runny. Once disposed between cold finger and dewar, gel 50 tends to remain in place even at higher temperatures with very little creep. Furthermore, gel 50 is reasonably inert and therefore is resistant to gas absorption. As gel 50 is thus heated from ambient temperatures very little, if any, outgassing occurs from gel 50.

Each of these stable characteristics serves to improve the thermal conductivity between cold finger 14 and detector 18 and thus result in the baseline decrease in inherent video noise within detector 18 as exhibited at the lower temperature 60 of FIG. 4.

As a result an improvement is devised in a cryogenically cooled detector which provides a constant thermal interface between the heat sink and the detector. This allows a stable closed-loop circuit performance over a wider temperature range which heretofore has been unreliably obtainable. Furthermore, the thermal noise within the detector is reduced by at least 10 dB at temperatures below 77 degrees K. The result is that the detectors can now be practically utilized to perform over a wide temperature range consistent with theoretical noise predictions inherent to such semi-conductor detectors. Furthermore, as a result of this improvement, any requirement for critical mechanical tolerances between the cold finger and the dewar including tolerances between the cold finger-dewar-shims, heater, wraps of tape, wadding and other materials is reduced. The result is a virtual and complete elimination of thermal video-flash phenomenon which otherwise occurs at the 77-degree K. transition point of liquid nitrogen. The risk of any damage to the dewar is thereby substantially decreased. The structure of the cryogenically cooled detector is also vastly simplified, chiefly with a significant reduction in the cost and time of assembly. The assembly has been so simplified by the invention that in many cases the design of the cryogenically cooled detector allows for field replacement of component parts which was heretofore difficult. The increased mechanical and thermal stability is directly observed as improved thermal conductivity with the result that power requirements for a heater element to assist in closed loop operation is eliminated.

Many modifications and alterations may be made by those having ordinary skill in the art without departing from the spirit and scope of the present invention. For example, in the illustrated embodiment the silicone polymer gel 50 has been described as SYLGARD 527. However, it should be expressly understood that any compound having the characteristics equivalent to or substantially similar to those described above could be substituted without departing from the scope of the invention. The illustrated embodiment has therefore been set forth only for the purposes of example and clarity and should not be read as limiting the invention defined by the following claims.

What is claimed is:

1. An improvement in a cryogenically cooled detector apparatus including a detector and a cryogenic cold source for cooling said detector, said improvement comprising:

cold finger means for thermally coupling said cryogenic cold source to said detector;

dewar means for thermally insulating said cold finger means, said cold finger means being disposed at least in part in said dewar means, and flowable gel means disposed between said cold finger means and dewar means for substantially filling said space between said cold finger means and dewar means at temperatures from ambient to cryogenic temperatures without loss of adhesion to said dewar means and cold finger means and without loss of internal adhesion of said gel means as said gel means is cooled from ambient temperatures to cryogenic temperatures, such that liquefication of air within said space between dewar means and said cold finger means is eliminated and such that video-flashing of said detector is eliminated.

2. The improvement of claim 1 wherein said gel means is a silicone polymer completely filling that portion of said space between said cold finger means and dewar means which is cooled to approximately 77 degrees K. and colder.

3. The improvement of claim 1 wherein said flowable gel means is self-sealing within the temperture range of −60 degrees C. to −100 degrees C.

4. The improvement of claim 1 wherein said flowable gel means is sticky and adheres to said cold finger means and dewar means from ambient temperatures through −60 degrees C.

5. The improvement of claim 1 wherein said flowable gel means is substantially resistant to outgassing when heated from ambient to 71 degrees C.

6. The improvement of claim 1 wherein said flowable gel means is characterized by a substantially constant viscosity from elevated ambient temperatures through −60 degree C.

7. An improvement in a cryogenically cooled detector including a detector and a cryo-engine for cooling said detector comprising a cold finger means for thermally coupling said cryo-engine to said detector;

a dewar means enveloping said cold finger means for insulating said cold finger means from the ambient, a space being defined between said dewar means and cold finger means; and a self-sealing gel means disposed in said space for excluding liquefiable gases from said space, said self-sealing gel means characterized by an ability to maintain adhesion to said dewar means and cold finger means and to self-seal from ambient temperatures to at least temperatures within the range of −60 degrees C. to −100 degrees C., such that video noise levels in said detector are reduced and video-flashing eliminated when the temperature is at 77 degrees K.

8. The improvement of claim 7 where said self-sealing gel means comprises a silicone polymer compound.

9. The improvement of claim 7 wherein said self-sealing gel means is adherent to said cold finger means, dewar means and said detector, said self-sealing gel means for providing a stable thermal conductive path between said cold finger means and said detector.

10. The improvement of claim 9 wherein said self-sealing gel means is adherent to said cold finger means and dewar means from ambient temperatures through −60 degrees C.

11. The improvement of claim 7 wherein said self-sealing gel means assumes a nonuniform temperature when said detector is cooled to cryogenic temperatures, a portion of said self-sealing gel means assuming said cryogenic temperature and a continuous remaining portion of said self-sealing gel means assuming a warmer temperature, said self-sealing gel means characterized by stable self-cohesion during said cooling and contraction.

12. An improvement in a method for preventing video-flashing in a cryogenically cooled detector, said method comprising the steps of cooling a cold finger with a cryogenic cold source, transferring said cooling through said cold finger to a detector, and insulating said cold finger with an enveloping dewar, said dewar and cold finger defining a space therebetween, said improvement comprising the steps of:

substantially completely filling said space in the vicinity of said detector with a flowable thermally stable self-sealing gel; and maintaining adhesion of said gel with said cold finger and dewar as said gel is cooled to said cryogenic temperatures, such that video noise is reduced and said video-flashing is eliminated.

13. The method of claim 12 where in said step of filling said space, said space is filled with gel which is self-sealing to a temperature within the range of −60 degrees C. to −100 degrees C.

* * * * *